(12) United States Patent
Shoop et al.

(10) Patent No.: US 7,209,331 B2
(45) Date of Patent: Apr. 24, 2007

(54) METHOD AND POWER FEED FOR ELECTRICAL INSPECTIONS

(75) Inventors: Steven Glen Shoop, Fallbrook, CA (US); Stephen Cameron Fomby, San Diego, CA (US); Tim Rikkers, Madison, WI (US)

(73) Assignee: Southern California Technology, Inc., San Diego, CA (US)

( * ) Notice: Subject to any disclaimer, the term of this patent is extended or adjusted under 35 U.S.C. 154(b) by 0 days.

(21) Appl. No.: 11/395,898

(22) Filed: Mar. 31, 2006

(65) Prior Publication Data

US 2006/0250729 A1     Nov. 9, 2006

Related U.S. Application Data

(63) Continuation-in-part of application No. 11/122,550, filed on May 5, 2005, now abandoned.

(51) Int. Cl.
*H02H 3/00* (2006.01)
*H01H 9/20* (2006.01)
*H01R 33/945* (2006.01)

(52) U.S. Cl. .................. 361/42; 200/50.14; 200/50.18; 439/517

(58) Field of Classification Search .................. 361/42; 324/527–528; 200/50.1, 50.14, 50.18; 439/517
See application file for complete search history.

(56) References Cited

U.S. PATENT DOCUMENTS

| | | | | |
|---|---|---|---|---|
| 4,837,519 A * | 6/1989 | Lopetrone et al. | .......... | 324/529 |
| 5,041,001 A * | 8/1991 | Giles | .......... | 439/189 |
| 5,118,301 A * | 6/1992 | Bentivolio | .......... | 439/188 |
| 5,334,939 A * | 8/1994 | Yarbrough | .......... | 324/424 |
| 5,515,218 A * | 5/1996 | DeHaven | .......... | 361/45 |
| 5,835,319 A * | 11/1998 | Welles et al. | .......... | 361/5 |
| 6,734,682 B2 * | 5/2004 | Tallman et al. | .......... | 324/528 |
| 6,788,504 B2 * | 9/2004 | Vanderkolk | .......... | 361/42 |
| 2006/0089028 A1 * | 4/2006 | Higham et al. | .......... | 439/136 |

* cited by examiner

*Primary Examiner*—Stephen W. Jackson
*Assistant Examiner*—Scott Bauer
(74) *Attorney, Agent, or Firm*—Nydegger & Associates (57) ABSTRACT

A device is provided for inspecting an installed electrical system including a power panel and branch circuits with respective circuit breakers. The device includes a power interface unit with a Ground Fault Circuit Interrupter (GFCI) for connection with the power panel. Further, the device includes a power source for temporarily powering the electrical system through the GFCI. For safety purposes, the device allows the energized GFCI to be closed only when the device and the power panel are connected. Moreover, the device provides for selective closing of the circuit breaker of an individual branch circuit to test a power response thereof to indicate whether the individual branch circuit has a fault therein.

20 Claims, 8 Drawing Sheets

METHOD AND POWER FEED FOR ELECTRICAL INSPECTIONS

This application is a continuation-in-part of application Ser. No. 11/122,550, filed May 5, 2005, now abandoned. The contents of application Ser. No. 11/122,550 are incorporated herein by reference.

FIELD OF THE INVENTION

The present invention pertains generally to devices and methods for testing electrical systems. More specifically, the present invention pertains to devices and methods for temporarily powering electrical systems for inspection of the systems' branch circuits and branch circuit breakers. The present invention is particularly, but not exclusively, useful as a device and method for selectively closing the circuit breaker of an individual branch circuit to test a power response as an indication of whether the tested branch circuit has a fault.

BACKGROUND OF THE INVENTION

In the United States, about 2 million new homes and many thousands of new commercial and industrial buildings are constructed every year. During the earliest stages of construction, temporary power is provided at the building site for electric power tools. As construction progresses, a power panel and associated branch circuit breakers are installed along with electric circuits that will ultimately provide power throughout the structure. Typically, however, no power is provided to these circuits until the entire electrical installation has been completed, and all circuits are in place. This allows for the correction of any defects that may be identified prior to the formal inspection. This preliminary inspection requires that the structure be energized or "heated up" with temporary electric power. Many techniques have been used to provide this temporary electric power for checking the electrical circuits in the structure.

One commonly used technique for checking the electrical circuits of a structure involves stripping the insulation from two short pieces of copper wire. The pieces of wire are then forced into two power receptacles of a socket that is provided on the power panel for connection to an electric power meter. Specifically, in this method, the female plug is removed from a 240 volt extension cord and the insulation of the cord is stripped off. The stripped ends of the cord are then connected and taped to the short copper wires extending outward from the meter socket jaws. With this connection completed, the extension cord is plugged into a 240 volt receptacle. As a result, power is provided to the structure's electrical system. Clearly, this technique and other similar techniques produce significant fire hazards and safety risks. For instance, the bare wires used in making the temporary power connection can arc and start a fire. Further, due to improper installation, a ground fault within the electrical system may not be detected and could result in a fire before detection occurs. Moreover, if a neutral wire is not properly grounded, the voltage applied thereto may float between the two phases of electricity and lead to over or under voltage in the circuit. This presents the possibility of a 240 volt electrical shock, with a consequent failure of tools and/or equipment. Further, the use of bare conductors to connect temporary power to a structure presents a danger of shocking workers in the area. In fact, shocks are possible whether the bare conductors are connected as intended, or whether they are inadvertently disconnected from the panel.

A second technique for checking the electrical circuits of a structure involves stripping the insulation off of two hot wires of an extension cord, and feeding the two exposed wires into the load side of a breaker. Then the entire electrical system is back-fed from the extension cord. This method includes the same attendant fire and electrocution hazards as discussed above. In addition to those hazards, if the temporary connection is left in place and the electric meter is installed by the local utility, then the utility grid could be back-fed, resulting in risks to utility workers.

Another technique involves the connection of temporary power to either an air conditioning disconnect or a 240 volt ac dryer or oven outlet. This technique, however, is not preferred because it could also provide a back feed to the entire system causing risk of electric shock. Further, this technique allows the disconnect or outlet to be energized while exposed.

In light of the above, it is an object of the present invention to provide a device and method that provides for inspection of an electrical system which significantly reduces the threat of electrical shock or fire. Another object of the invention is to provide a device and method for inspecting an electrical system which avoids the use of stripped wiring. Still another object of the invention is to provide a device and method for preventing or reducing the threat of fires when a circuit having a fault is inspected. Still another object of the invention is to provide a device and method for diagnostic testing of an electrical system which utilizes a Ground Fault Circuit Interrupter (GFCI) upstream of the system. Yet another object of the present invention is to provide a device and method for inspecting electrical systems which is easy to implement, simple to perform, and cost effective.

SUMMARY OF THE INVENTION

In accordance with the present invention, a device is provided to inspect an electrical system that has been newly installed in a structure. Specifically, the inspection is made of the complete system, including the system's power panel, and its main circuit breaker, as well as a plurality of individual branch circuits that respectively include a circuit breaker that is connected to the power panel. For the present invention, the device comprises a power interface unit that includes a Ground Fault Circuit Interrupter (GFCI). The power interface unit can be powered by a power source and connected to all of the branch circuits via the main breaker. Also, the device includes a means for selectively closing the circuit breaker of an individual branch circuit to test its power response. In this manner, it can be determined whether the tested branch circuit has a fault.

In addition to testing whether a particular branch circuit has a fault, the device of the present invention also includes a toner, or a toner jack for connection to a toner, for identifying the location of a fault in the tested branch circuit. As a safety feature, in order to provide for the safe use of the toner, the device is provided with a means for preventing connection of the toner to the tested branch circuit while the branch circuit is powered by the power source. For instance, the power interface unit may be provided with a relay assembly which allows connection of the electrical system to the power source or to the toner, but never to both the power source and the toner at the same time. Alternatively or additionally, the unit may be provided with toner posts for connection to the toner, and with a toner post cover. For such an embodiment, the toner post cover is used to block any connection between the toner posts and the toner when the GFCI is closed.

Other safety precautions, in addition to those disclosed above, are provided for in the present invention. For instance, the device includes a trip circuit for allowing the GFCI to be closed only when the power interface unit and the power panel are connected. Functionally, the trip circuit produces a ground fault when the device is not connected to the power panel. To do this, the trip circuit includes a ground wire that is selectively connected to a neutral wire in the device only when the device is disconnected from the power panel. Further, a switch is provided for disconnecting the trip circuit from the GFCI when the power interface unit is connected to the power panel.

For the operation of the electrical inspection device of the present invention, the following steps are performed. First, a visual inspection is made to ensure that the main circuit breaker and all branch circuits of the electrical system are open. The power interface unit is then connected to the power panel and is energized by the power source. Once the power interface unit is energized, the GFCI and the main circuit breaker are closed. Next, the circuit breakers of individual branch circuits are selectively closed to test for a power response that will indicate whether the individual branch circuit has a fault. If it is determined that a branch circuit has a fault, the GFCI is automatically opened. In response, the branch circuit with the fault is also opened. The GFCI is then reset before any remaining branch circuits are sequentially closed to test their respective power responses.

After all circuits have been tested as disclosed above, all branch circuit breakers and the main circuit breaker are again opened. The GFCI is then opened, thereby allowing for an electrical connection between the toner and the electrical system. Thereafter, the main circuit breaker is closed. Then, a branch circuit having a fault is selected and its circuit breaker is closed. The toner is then activated to produce a tone in the selected circuit and a receiver for responding to the tone is operated to identify the location of the fault in the selected circuit. After the receiver identifies the location of the fault, the fault is repaired using standard electrical trouble-shooting and repair procedures. After all circuits with faults have been repaired, the toner is deactivated and is disconnected from the power interface unit. A final check of the electrical system may be performed. This is done by ensuring that all individual branch circuits are open and that the GFCI and the main circuit breaker are closed. Each branch circuit breaker is then sequentially closed to verify that no faults remain. When no faults remain, each branch circuit breaker and the main circuit breaker are opened. At the end of the inspection, the GFCI is opened and the power interface unit is de-energized before being disconnected from the power panel.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION OF THE PREFERRED EMBODIMENTS

Figure 1:
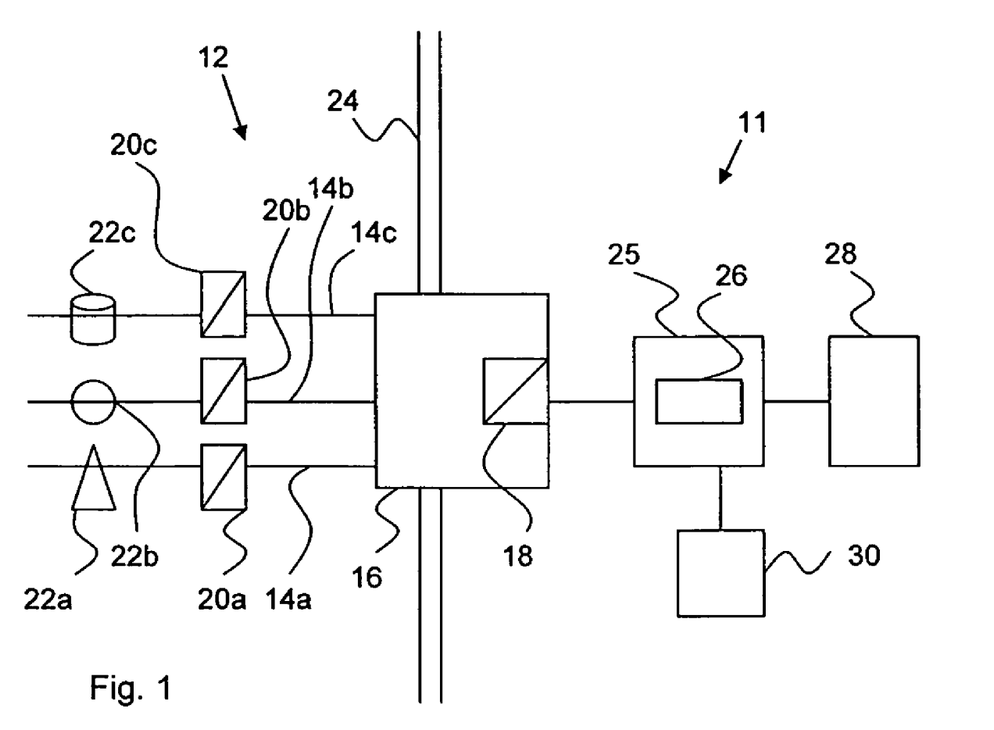
FIG. 1 is a schematic representation of the interconnection between an electrical system and a device for testing the system in accordance with the present invention.

Referring initially to FIG. 1, a device, generally designated 11, is shown in position for inspecting an electrical system, generally designated 12, in accordance with the present invention. As shown in FIG. 1, the electrical system 12 includes a plurality of branch circuits 14, of which the circuits 14a–c are exemplary, that are connected to a power panel 16. In a typical construction, the power panel 16 includes a main circuit breaker 18. Also, each branch circuit 14a–c includes a respective circuit breaker 20a–c as well as various electrical apparatus 22a–c such as electrical outlets and appliances. As shown, the device 11 is connected to the power panel 16 for electrical circuit inspections. For the present invention, the electrical system 12 is inspected after it is installed in a structure 24.

As will be appreciated by reference to FIG. 1, the device 11 includes a power interface unit 25 which includes a ground fault circuit interrupter (GFCI) 26 for inspecting the electrical system 12. As is typical, the GFCI 26 contains a small microprocessor that senses tiny current leaks and shuts off the power passing through the GFCI 26 almost immediately upon recognition of a leak. Specifically, the GFCI 26 monitors the power passing out of a hot wire and the power returning in a neutral wire. If the microprocessor senses a difference of just 1/200 of an amp, it trips the circuit in about 1/40 of a second or less. As a result, power is cut off before any serious damage can be done to equipment or personnel.

For providing electrical circuit inspections, the device 11 includes, or provides a connection to, a power source 28 that is capable of providing 120/240 volt AC temporary power to the power interface unit 25 and GFCI 26. Further, to facilitate the location of electrical faults in branch circuits 14, the device 11 provides for the connection of a toner 30 to the power interface unit 25 and GFCI 26.

Figure 2A:
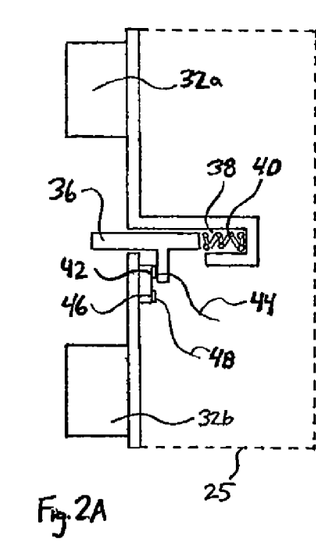
FIG. 2A is a schematic view of the internal components of an embodiment of a power interface unit used for the present invention.
Figure 2B:
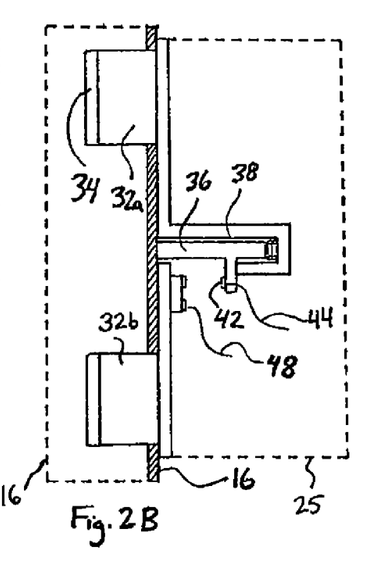
FIG. 2B is a view of the power interface unit shown in FIG. 2A during connection with a power panel.

Referring now to FIGS. 2A and 2B, a safety feature of the power interface unit 25 is illustrated. Specifically, the power interface unit 25 includes structure to ensure that the GFCI 26 can only be powered and closed when the power interface unit 25 is connected to a power panel 16. As shown, the power interface unit 25 includes spades 32 that project from the interface unit 25 and are received within corresponding slots 34 in the power panel 16 (schematically shown in FIG. 2B). Typically, the power interface unit 25 includes two spades 32a and 32b that provide electrical connection between the GFCI 26 (shown in FIG. 1) and the power panel 16. Further, the power interface unit 25 typically includes another pair of spades 32 that are not electrically functional, but instead facilitate physical connection between the power interface unit 25 and the power panel 16.

In order to prevent exposure of the electrically functional spades 32 when they are powered, the power interface unit 25 is provided with a piston 36 that serves to trip the GFCI 26. Specifically, the piston 36 is positioned in a chamber 38 that is formed in the unit 25. For the purposes of the present invention, the piston 36 is urged to its extended position (see FIG. 2A) by a spring 40, but is retractable within the chamber 38 (see FIG. 2B). As shown, a contact 42 is mounted on the piston 36. Also, the contact 42 is connected to a neutral wire 44. Further, a contact 46 is mounted on the unit 25 and is connected to a ground wire 48. As will be appreciated with reference to FIG. 2A, the neutral wire 44 and the ground wire 48 are electrically connected through the contacts 42 and 46 when the piston 36 is in its extended position. As a result of this connection, the GFCI 26 in the unit 25 would be tripped open if it were to somehow become closed and powered while the piston 36 is extended (i.e., when the spades 32 are not inserted into the slots 34).

As shown in FIG. 2B, during connection of the unit 25 to the power panel 16, the power panel 16 contacts and pushes the piston 36 into the chamber 38. As a result, the neutral wire 44 and the ground wire 48 are disconnected. Thereafter, when the interface unit 25 is engaged with the power panel 16, the GFCI 26 (shown in FIG. 1) may be powered and closed without interruption. In this manner, it is ensured that no power is provided to the spades 32 while they are exposed outside of the power panel 16.

Figures 3A, 3B:
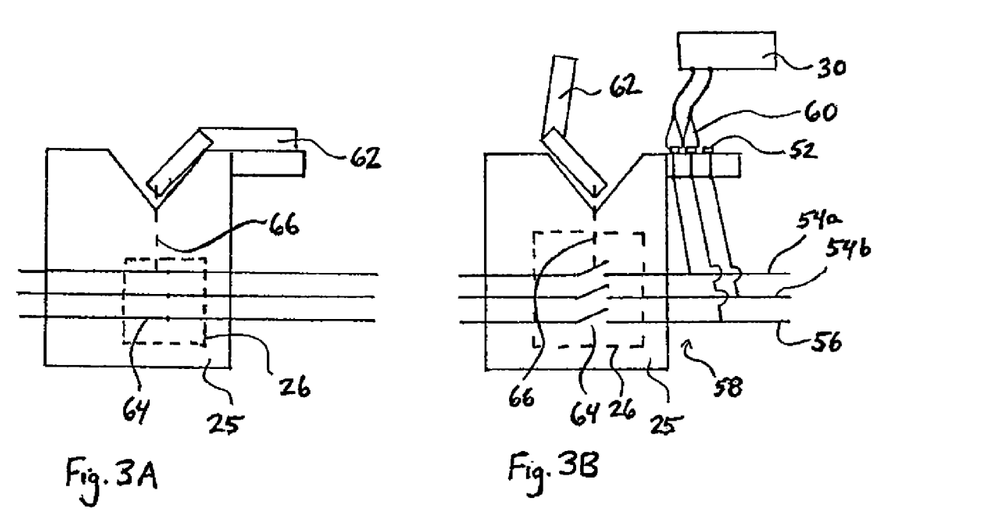
FIG. 3A is a schematic representation of the power interface unit with toner posts covered.
FIG. 3B is a schematic representation of the power interface unit shown in FIG. 3A, with toner posts uncovered and when connected with a toner.

Referring now to FIGS. 3A and 3B, another safety feature for the present invention is illustrated. Specifically, structure is provided to prevent connection of the toner 30 to the power interface unit 25 when the power interface unit 25 is powered. As shown in FIG. 3B, the unit 25 includes toner posts 52. As illustrated, these toner posts 52 are connected to hot wires 54a and 54b and a neutral wire 56 on the load side 58 of the GFCI 26. Further, the toner posts 52 can be connected to the toner 30 by alligator clips 60, as indicated in FIG. 3B. For the purposes of the present invention, the unit 25 includes a toner post cover 62. When in the closed configuration shown in FIG. 3A, the cover 62 prevents connection between the toner posts 52 and the toner 30. As is further shown in FIGS. 3A and 3B, the wires 54 and 56 include a switch 64 for opening and closing the GFCI 26. Further, the unit 25 includes a mechanical connection 66 between the switch 64 and the cover 62. As envisioned for the present invention, the mechanical connection 66 can be of any type well known in the pertinent art that will move the cover 62 in response to an operation of the switch 64. As a result, when the GFCI 26 is closed, as shown in FIG. 3A, the mechanical connection 66 requires that the cover 62 prevent any external electrical connection to the toner posts 52. On the other hand, when the GFCI 26 is opened, as shown in FIG. 3B, the mechanical connection 66 requires that the cover 62 be removed from the toner posts 52. As a result, connection between the toner posts 52 and the toner 30 is allowed. In this manner, it is ensured that the toner 30 cannot be connected to the unit 25 while the GFCI 26 is powered and closed.

Referring now to FIGS. 4A through 9, the structure of another embodiment of the device 11 of FIG. 1 is illustrated. In this embodiment, an alternative structure for preventing exposure of energized spades 32 is provided.

Figures 4A, 4B:
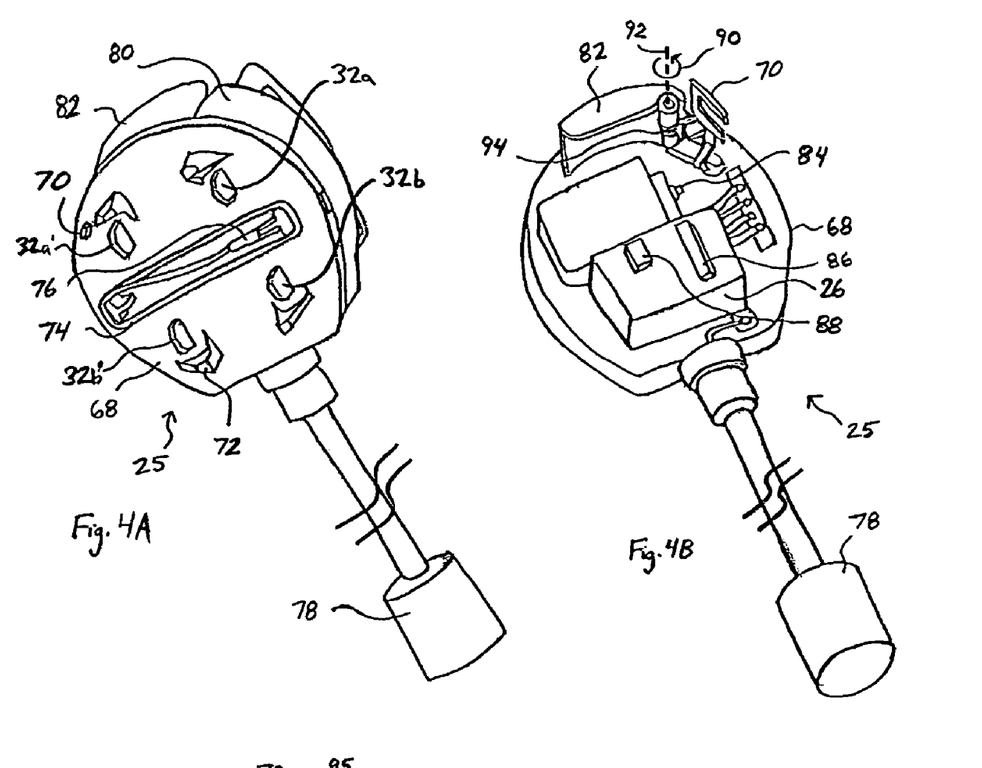
FIG. 4A is a perspective view of an embodiment of a power interface unit for use with the present invention.
FIG. 4B is a reverse perspective view of the power interface unit shown in FIG. 4A.

As shown in FIG. 4A, the power interface unit 25 for another embodiment of the present invention includes a mounting plate 68 from which two pairs of spades 32 extend. Spades 32a–b constitute one pair and the spades 32a'–b' constitute another. Positioned on the mounting plate 68 adjacent the spades 32 is a trigger 70 that may be axially retracted within the unit 25. Also extending from the mounting plate 68 are studs 72 that prevent objects from contacting and damaging the spades 32 when the unit 25 is not connected to a power panel 16 (shown in FIG. 1). Further, FIG. 4A shows that the unit 25 includes a neutral wire 74 which terminates at an alligator clip 76. The clip 76 can be connected to a neutral wire on the power panel 16 (shown in FIG. 1) to provide a neutral to the device 11. While FIG. 4A depicts a neutral wire 74 and alligator clip 76, it is known in the art that a spade, typically referred to as a fifth clip, may instead be used for grounding purposes. In fact, a variety of spade/terminal arrangements may be used to provide for power, grounding and connection support. Such arrangements include multiple four-clip, five-clip, seven-clip, and fifteen-clip arrangements; as well as a variety of associated voltages.

As further shown in FIG. 4A, the unit 25 is connected to a plug 78 that provides for connection to a power source 28 (shown in FIG. 1). Also, the unit 25 includes a cover 80 for covering its internal components. Extending out from under the cover 80 is a lever 82.

Turning now to FIG. 4B, the unit 25 is shown with the cover 80 removed to more clearly illustrate the internal components therein. As shown, the GFCI 26 is mounted to the plate 68 and is electrically connected to the plug 78. Adjacent and electrically connected to the GFCI 26 is a button switch 84. When not depressed, the button switch 84 closes a trip circuit (not illustrated) that connects the GFCI 26 directly to a ground wire. As a result, if the GFCI 26 is energized by the power source 28 (shown in FIG. 1) when the switch 84 is not depressed the GFCI 26 will automatically open. As is further shown in FIG. 4B, the GFCI 26 includes a breaker switch 86 and a test button 88. Also, it can be seen that the lever 82 is biased in the direction of arrow 90 about axis 92 by spring 94.

Figure 4C:
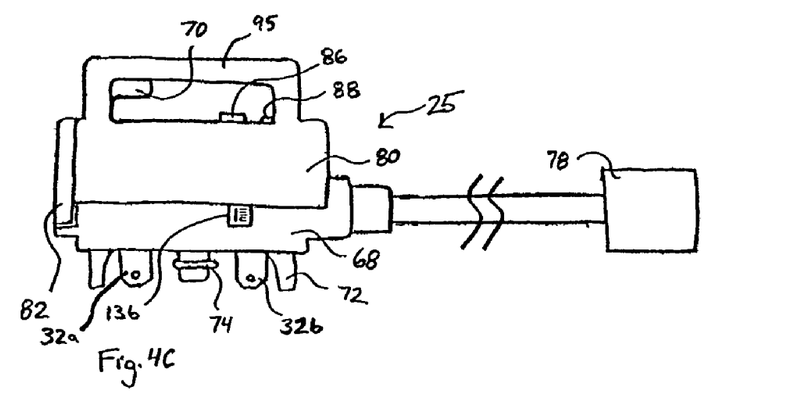
FIG. 4C is a side view of the power interface unit shown in FIG. 4A.

Referring now to FIG. 4C, it can be seen that both the trigger 70 and the lever 82 are exposed to allow for manual manipulation thereof. As shown, the cover 80 includes a handle portion 95, below which the trigger 70 extends.

Further, the lever 82 extends beyond the cover 80. Additionally, the breaker switch 86 and the test button 88 on the GFCI 26 are shown as extending beyond the cover 80 for manual operation. While FIGS. 4A–4C illustrate the structures of the power interface unit 25, their operation will be set forth in FIGS. 7A–7C and FIG. 8. First, however, the trigger 70 and the lever 82 are more specifically described.

Figures 5A, 5B, 5C:
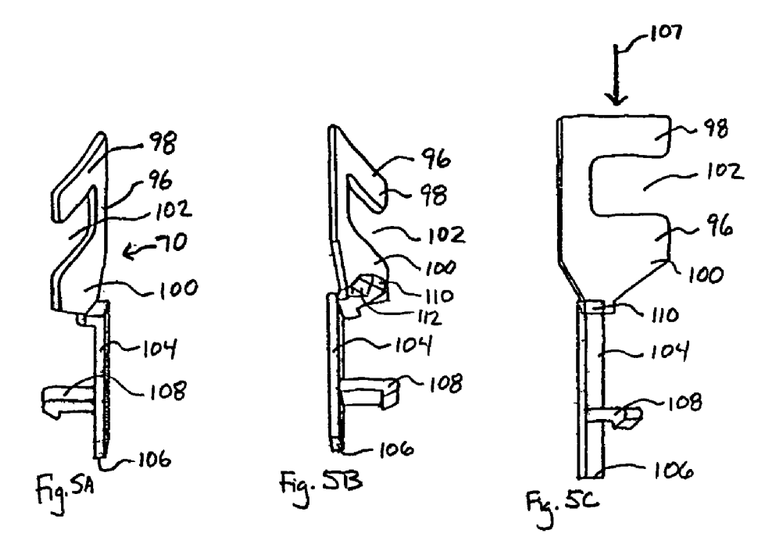
FIG. 5A is a perspective view of the trigger of the power interface unit of FIGS. 4A–4C.
FIG. 5B is another perspective view of the trigger of FIG. 5A.
FIG. 5C is a front view of the trigger of FIG. 5A.
Figure 5D:
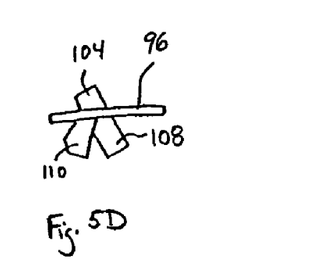
FIG. 5D is an overhead view of the trigger taken in the direction indicated by arrow 107 in FIG. 5C.
Figure 6A:
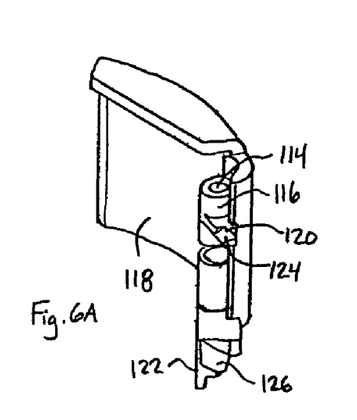
FIG. 6A is a perspective view of the lever used with the power interface unit shown in FIGS. 4A–4C.
Figure 6B:
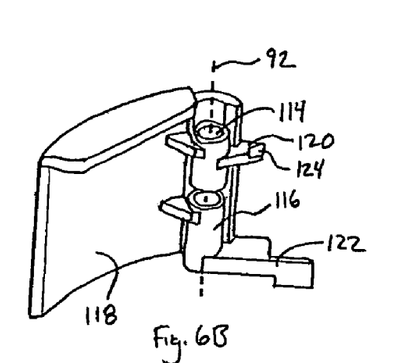
FIG. 6B is another perspective view of the lever of FIG. 6A.
Figure 6C:
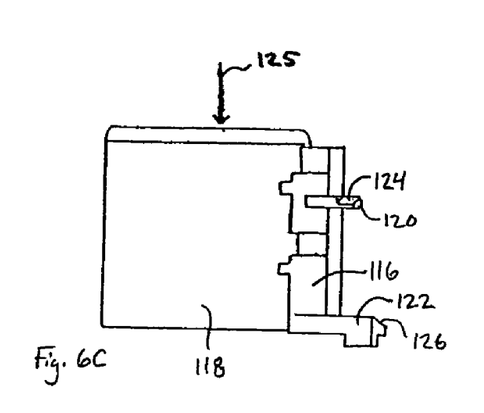
FIG. 6C is a front elevational view of the lever of FIG. 6A.
Figure 6D:
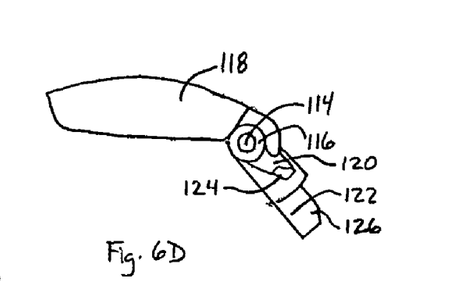
FIG. 6D is an overhead view of the lever taken in the direction indicated by arrow 125 in FIG. 6C.

In FIGS. 5A–5D, the structure of the trigger 70 is more clearly illustrated. As shown, the trigger 70 includes a C-shaped head portion 96 having an upper arm 98 and a lower arm 100 that bound a void 102. Further, the trigger 70 includes a shaft 104 that is offset from the head portion 96 and extends therefrom to a lower end 106. For the present invention, the trigger 70 also includes a hooked lower extension 108 and an upper extension 110 (hidden in FIG. 5A). As can be seen in FIG. 5B, the upper extension 110 includes an inclined surface 112.

In FIGS. 6A–6D, the structure of the lever 82 is set forth. As shown, the lever 82 includes a central channel 114 formed by cylindrical members 116 centered about the lever axis 92 (see FIG. 6B). Extending from the cylindrical members 116 is a lever arm 118. Extending from the cylindrical members 116 opposite the lever arm 118 are an upper abutment 120 and a lower abutment 122. As can be seen in FIGS. 6A–6D, the upper abutment 120 includes a sloped surface 124 and the lower abutment 122 includes a ramped surface 126 (hidden in FIG. 6B).

With the specific structure of the trigger 70 and the lever 82, as well as the other components of the unit 25 in mind, the cooperation of the unit's components may be clearly understood during the operation of the power interface unit 25 as depicted in FIGS. 7A–7D and 8A–8D. Specifically, through the cooperation of the structure of the power interface unit 25, it is ensured that power is never supplied to the spades 32 when they are exposed.

Figure 7A:
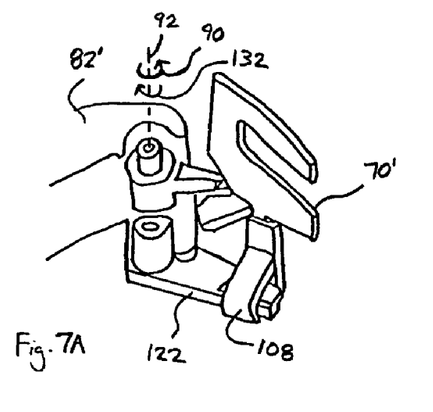
FIGS. 7A–7D are sequential, perspective views showing the interaction between the trigger and lever of the power interface unit during an operation of the unit.
Figure 8A:
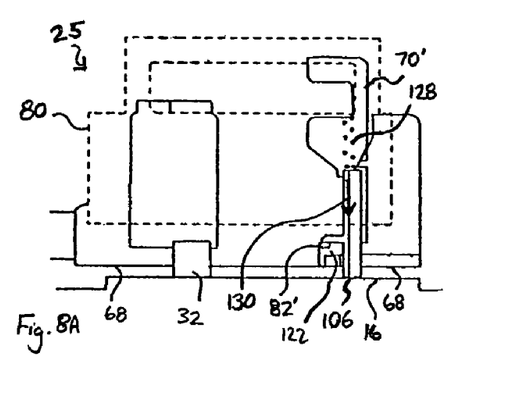
FIGS. 8A–8D are cross sectional views of the power interface unit showing movements of the trigger that correspond respectively to FIGS. 7A–7D.

Referring now to FIGS. 7A and 8A, the trigger is shown in its extended configuration 70'. As shown in FIG. 8A, the unit 25 includes a biasing element 128, such as a compressed spring, that urges the trigger 70' in the direction of arrow 130. As a result, the lower end 106 of the trigger 70' extends beyond the mounting plate 68. When the trigger 70' is in its extended configuration as shown, the lower end 106 of the trigger 70' will come into initial contact with the power panel 16 during a connection of the spades 32 with the power panel 16 (as shown in FIG. 8A). Further, when the trigger 70' is in its extended configuration, the lever 82' is held in its initial position by the engagement between the hooked lower extension 108 of the trigger 70' and the lower abutment 122 of the lever 82' as shown in FIG. 7A. As a result, movement of the lever 82' about axis 92 in the direction of arrow 132 is prevented.

Figure 7B:
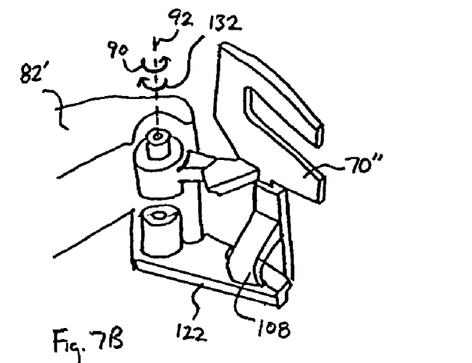
Figure 8B:
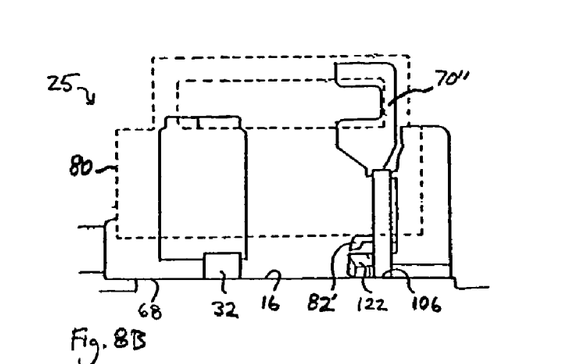

Referring now to FIGS. 7B and 8B, the unit 25 is shown after the spades 32 are fully received within the power panel 16. As shown, contact between the power panel 16 and the trigger's lower end 106 has moved the trigger to its retracted configuration 70". In its retracted configuration, the lower end 106 of the trigger 70" is substantially flush with the mounting plate 68 and power panel 16. Further, in its retracted configuration, the hooked lower extension 108 of the trigger 70" disengages the lower abutment 122 of the lever 82'. As a result, the lever 82' is no longer locked against movement in the direction of arrow 132 about axis 92. As shown in FIGS. 7B and 8B, however, the lever 82' has not yet rotated as it is biased in the direction of arrow 90 toward its initial position by the spring 94 (shown in FIG. 4B).

Figure 7C:
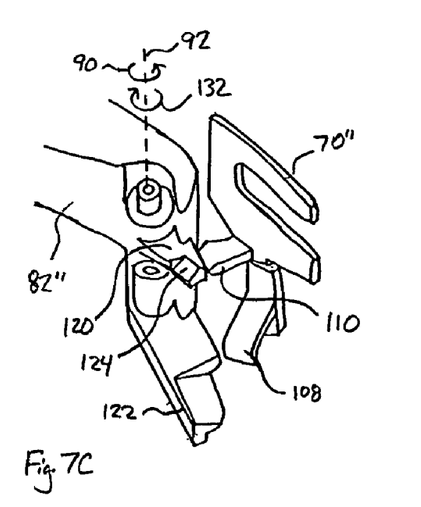
Figure 8C:
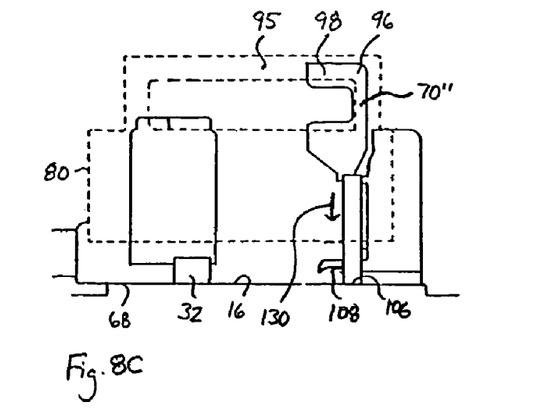

Referring now to FIGS. 7C and 8C, the unit 25 is shown with the lever in its activated position 82". Specifically, the lever 82" has been manually rotated about the lever axis 92 in the direction of arrow 132. During this movement, the sloped surface 124 of the upper abutment 120 of the lever 82" contacts and lifts the upper extension 110 of the trigger 70". After the upper abutment 120 of the lever 82" has cleared contact with the upper extension 110 of the trigger 70", the biasing element 128 (shown in FIG. 8A) urges the trigger 70" in the direction of arrow 130 until the lower end 106 again contacts the power panel 16. With this movement of the trigger 70', the upper extension 110 of the trigger 70" slips behind the upper abutment 120 of the lever 82". As a result, the upper extension 110 prevents movement of the lever 82" about the axis 92 in the direction of arrow 90.

Cross-referencing FIG. 7C with FIG. 4B, it can be seen that, when in the activated position, the lower abutment 122 of the lever 82" contacts and depresses the button switch 84 connected to the GFCI 26. For the purposes of the present invention, the button switch 84 interrupts a trip circuit (not illustrated) that otherwise prevents the GFCI 26 from being energized while closed. As a result, the button switch 84 must be depressed in order to energize and close the GFCI 26, i.e., the spades 32 can be powered only when the button switch 84 is depressed by the lower abutment 122 of the lever 82". In this manner, it is ensured that the spades 32 are not powered when exposed.

With this safety feature in mind, the proper disconnection of the unit 25 from the power panel 16 may be explained. Referring initially to FIG. 8C, it can be seen that the upper arm 98 of the C-shaped head portion 96 of the trigger 70" is exposed beneath the handle portion 95 of the cover 80. As a result, the upper arm 98 of the trigger 70" may be manipulated to move the trigger 70" from its retracted configuration 70".

Figure 7D:
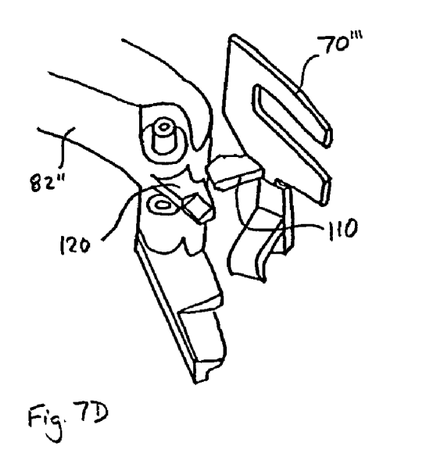
Figure 8D:
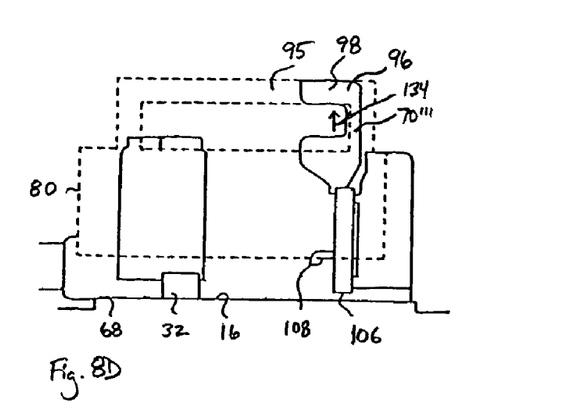

Cross-referencing FIGS. 8D and 8C, it can be seen that the trigger in FIG. 8D has been manually moved to its withdrawn configuration 70'" by pushing the upper arm 98 of the C-shaped head portion 96 of the trigger 70'" in the direction of arrow 134 until the upper arm 98 is flush with the handle portion 95 of the cover 80. As can be seen from FIG. 7D, when the trigger 70'" is in the withdrawn configuration, the upper extension 110 of the trigger 70'" disengages the upper abutment 120 of the lever 82". As a result of this disengagement between the upper extension 110 and the upper abutment 120, the lever 82" will immediately be returned to its initial position 82' by the biasing force of the spring 94 (shown in FIG. 4B) about the axis 92 in the direction of arrow 90. As lever 82 disengages the button switch 84 (shown in FIG. 4B), the GFCI trip circuit (not illustrated) is closed and the GFCI 26 will be automatically opened, if energized. Thereafter, the unit 25 may be disconnected from the power panel 16 without exposing the spades 32 while energized.

While the present invention provides a safe method of intentionally disconnecting the unit 25 and the power panel 16, it also provides a safe method of unintentional disconnection therebetween. Referring back to FIGS. 7C and 8C, it can be seen that the upper extension 110 prevents movement of the lever 82" in the direction of arrow 90 about axis 92. As seen in FIGS. 7D and 8D, the trigger 70'" may be manually withdrawn in the direction of arrow 134 to disengage the upper extension 110 and the upper abutment 120. However, that is not the only way in which the upper extension 110 and the upper abutment 120 may be disengaged. Specifically, if the unit 25 is pulled from the power panel 16, the biasing element 128 (shown in FIG. 8A) will force the trigger 70 to move in the direction of arrow 130 to its extended configuration 70'. As a result, the upper extension 110 will disengage the upper abutment 120. Upon disengagement of the extension 110 and the abutment 120, the spring 94 (shown in FIG. 4B) will immediately rotate the lever 82 about the axis 92 in the direction of arrow 90 to the lever's initial position 82'. With this rotation of the lever 82, the button switch 84 will no longer be depressed and the GFCI trip circuit (not illustrated) will be closed. As a result, the GFCI 26 will be automatically opened if energized and the spades 32 will not be exposed while energized.

Figure 9:
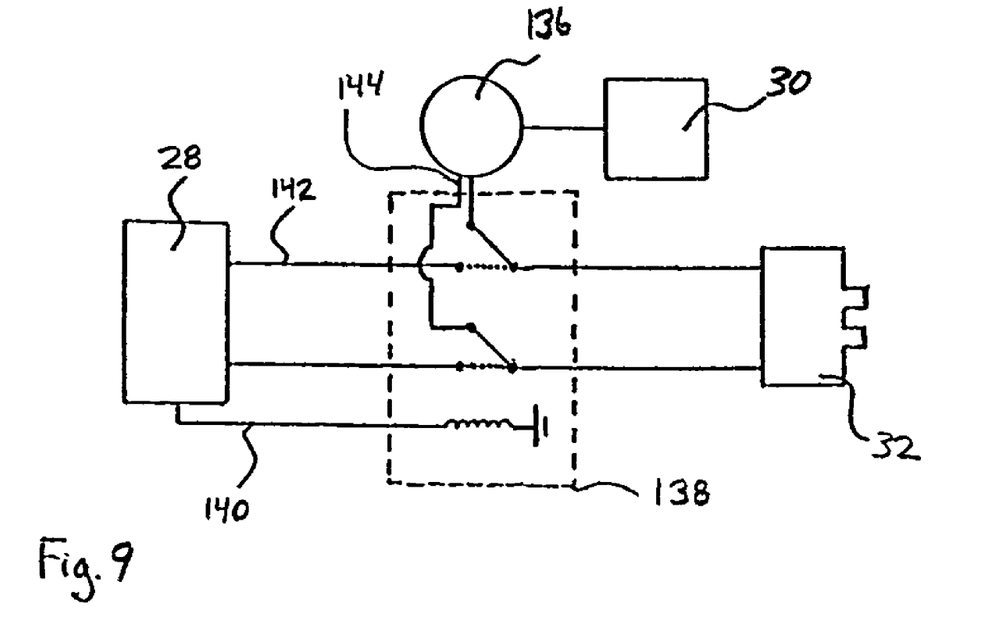
FIG. 9 is a simplified schematic drawing depicting the circuitry connecting the spades to the power source or the toner in accordance with an embodiment of the present invention.

For the embodiment of the invention disclosed in FIGS. 1 and 4A–4C, another safety feature is provided. Specifically, a feature is provided to prevent electrical connection of the power source 28 and a toner 30 (both shown in FIG. 1). Referring back to FIG. 4C, it will be noticed that the unit 25 includes a telephone jack-type toner port 136 for connection to a toner 30 (shown in FIG. 1). Referring now to FIG. 9, the port 136 for connection to the toner 30 is illustrated in an electrical diagram. Specifically, in FIG. 9, simplified electrical circuits between the power source 28 and the spades 32, and between the toner port 136 and the spades 32, are illustrated. As can be seen, a relay assembly 138 is provided to ensure that the power source 28 never provides a current to the toner 30. As a result, there is no danger of damaging the toner 30 with the power source 28. As shown in FIG. 9, no current is being provided from the power source 28 to the relay assembly 138 via line 140. Because the relay assembly 138 is not being powered, the circuit 142 between the power source 28 and the spades 32 is open and the circuit 144 between the toner 30 and the spades 32 is closed. When the power source 28 is turned on to provide power to the relay assembly 138 through line 140, the relay assembly 138 opens the circuit 144 between the toner 30 and the spades 32 and closes the circuit 142 between the power source 28 and the spades 32. In this manner, connection between the unit 25 and a toner 30 is provided for without danger of damaging the toner 30 with current from the power source 28.

Figure 10:
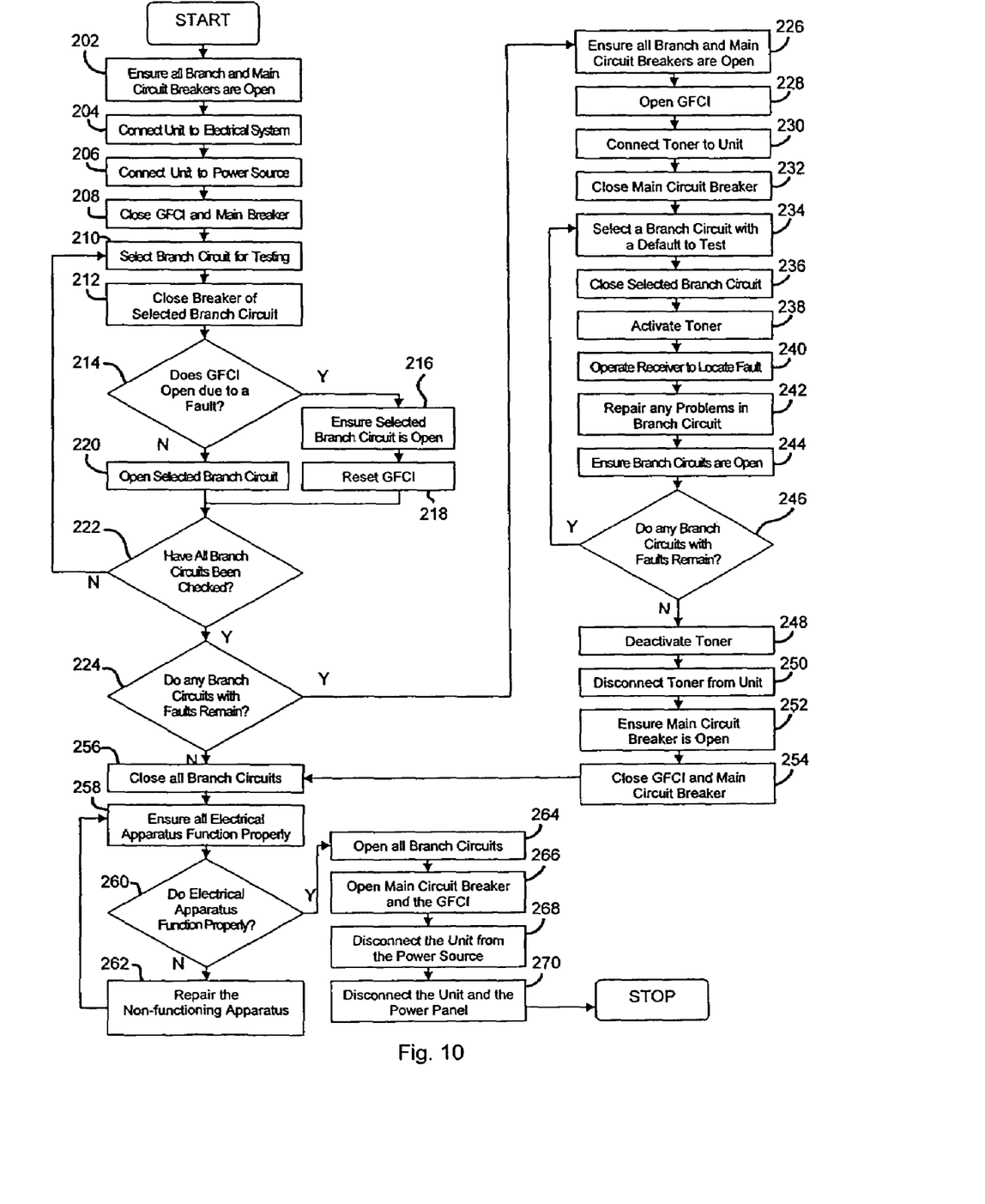
FIG. 10 is an operational flow chart showing the steps of the method of the present invention.

Referring now to FIG. 10, the operation of the device 11 is set forth in the provided flow chart. When testing the electrical system 12 installed in a structure 24, the initial step is to ensure that the main circuit breaker 18 and all branch circuit breakers 20 are open (action block 202). Then, as shown in action block 204, the power interface unit 25 is connected to the electrical system 12 through the power panel 16. Thereafter, the power interface unit 25 is connected to the power source 28 (action block 206). As shown, the GFCI 26 and the main circuit breaker 18 are then closed (action block 208). At this point, the device 11 is ready to provide electrical testing.

As shown at action block 210, an individual branch circuit 14 is selected for testing. Then, the selected branch circuit 14 is closed (action block 212). If the selected branch circuit 14 has a fault, the GFCI 26 will automatically open. At inquiry block 214, it is determined whether the GFCI 26 has opened due to a fault. If it has, then it is ensured that the selected branch circuit 14 is opened (action block 216) and the GFCI 26 is reset (action block 218). If the GFCI 26 has not opened, then the selected circuit 14 does not have a fault and the circuit 14 is opened (action block 220). In either case, at inquiry block 222 it is determined whether any untested circuits 14 remain. If there are untested circuits 14, then the method returns to action block 210 in which another individual circuit 14 is selected for testing.

When no untested circuits 14 remain, then inquiry block 224 determines whether any circuits 14 with faults were identified. If yes, then the next step, at action block 226, is to ensure that all branch circuit breakers 20 and the main circuit breaker 18 are open. Thereafter, the GFCI 26 is opened (action block 228) and the toner 30 is connected thereto (action block 230). Once the toner 30 is connected to the power interface unit 25 and GFCI 26, the main breaker 18 is closed (action block 232), and an individual circuit 14 with a fault is selected for further testing (action block 234). When selected, the individual branch circuit 14 is closed (action block 236). Then the toner 30 is activated to send a generated tone to the selected circuit 14 (action block 238). Thereafter, a receiver is operated to locate any faults, shorts, open circuits or conductors (action block 240). Specifically, the receiver indicates whether the tone in the circuit 14 breaks or dissipates and, if so, where. When a problem is located by the receiver, it is repaired in accordance with standard electrical trouble-shooting procedure (action block 242). Afterwards, it is again ensured that all branch circuits 14 are open (action block 244). Then it is determined whether any circuits 14 with faults remain (inquiry block 246). If circuits 14 with faults remain, then the method moves back to action block 234, in which another branch circuit 14 with a fault is selected for further testing.

When no circuits 14 with faults remain, then the toner 30 is deactivated (action block 248). Once deactivated, the toner 30 is disconnected from the power interface unit 25 (action block 250). Thereafter, it is ensured that the main circuit breaker 18 is open (action block 252). Then the GFCI 26 and the main circuit breaker 18 are closed (action block 254).

As shown in FIG. 10, both action block 254 and a negative response to inquiry block 224 lead to action block 256 in which the branch circuit breakers 20 are closed. Specifically, at this stage in the method, it has been determined that the circuits 14 do not have any faults and the electrical apparatus 22, such as appliances and outlets, are to be tested. This step is taken at action block 258. As indicated at inquiry block 260, if problems with the electrical apparatus 22 are found, then the apparatus 22 are repaired at action block 262 and the testing at action block 258 is repeated.

When no problems in the electrical apparatus 22 are found, the branch circuits 14 are opened (action block 264). Then the main circuit breaker 18 and the GFCI 26 are opened (action block 266). After the GFCI 26 is opened, it is disconnected from the power source 28 (action block 268) and the power panel 16 (action block 270). As a result of these steps, it is ensured that the electrical system 12 is properly installed and the electrical system 12 is released from formal inspection.

While FIG. 10 illustrates a method having a specific order of steps, it is contemplated that the steps of the method may be performed in a different order than set forth. For instance, a circuit 14 found to have a fault at inquiry block 214 could be immediately tested with the toner 30 at action blocks 226 through 244.

While the particular Method and Power Feed for Electrical Inspections as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A device for inspecting an electrical system, wherein the electrical system is installed in a structure and includes a power panel and a plurality of branch circuits, with each branch circuit having a respective circuit breaker connected to the power panel, the device comprising:

a power source;

a power interface unit including a Ground Fault Circuit Interrupter (GFCI) for interconnecting the power source with the power panel;

a means for selectively closing the circuit breaker of an individual branch circuit to test a power response thereof to indicate whether the individual branch circuit has a fault therein; and a protective means for preventing closing of the GFCI when the GFCI is powered and the device and the power panel are disconnected, said protective means including a means for producing a ground fault when the device is powered and disconnected from the power panel.

2. A device as recited in claim 1 wherein the electrical system includes a main circuit breaker mounted on the power panel for interconnecting the plurality of individual branch circuits to the GFCI.

3. A device as recited in claim 1 further comprising a toner for identifying a location of the fault in the individual branch circuit.

4. A device as recited in claim 3 further comprising a means for preventing connection of said toner to said individual branch circuit while said branch circuit is powered by said power source.

5. A device as recited in claim 4 wherein the GFCI includes means for connection to the toner, wherein said preventing means includes a cover mounted on the GFCI, and wherein said cover blocks connection between said connection means and said toner when the GFCI is closed.

6. A device as recited in claim 1 wherein said producing means includes a trip circuit comprising a ground wire and a neutral wire, with said ground wire connected to said neutral wire when the device is disconnected from the power panel, and wherein said producing means includes a switch for disconnecting the ground wire from said neutral wire when the device is connected to the power panel.

7. A device as recited in claim 6 wherein said power interface unit includes a mounting plate with spades extending from the mounting plate for electrical connection to the power panel, and wherein said switch comprises:

a piston moveable between an extended position, in which a distal end of the piston extends through the mounting plate, and a retracted position in which the distal end of the piston is substantially flush with the mounting plate;

a means for urging the piston to the extended position;

a first contact mounted on the piston; and a second contact mounted on the mounting plate for abutting the first contact when the piston is in the extended position to form a trip circuit when connected.

8. A device as recited in claim 6 further comprising:

a lever moveable between an initial position and an activated position, with said lever opening the switch in the activated position;

a means for biasing the lever toward the initial position; and a trigger for controlling movement of the lever, said trigger being moveable between an extended configuration, a retracted configuration and a withdrawn position, with said trigger retaining said lever in the initial position when said trigger is in the extended position, with said trigger holding said lever in the activated position when said trigger is in the retracted position, and with said trigger disengaging said lever to allow said lever to return to the initial position when said trigger is in the withdrawn configuration.

9. A device for inspecting an electrical system comprising:

a power interface unit for connection to the electrical system;

a power source for powering the electrical system;

a Ground Fault Circuit Interrupter (GFCI) mounted to the power interface unit for interconnecting the power source with the electrical system;

a means for requiring that the GFCI be open when the GFCI is powered by the power source and disconnected from the electrical system, wherein said requiring means produces a ground fault during an attempt to close the GFCI when the GFCI is powered by the power source and is disconnected from the electrical system; and a means for selectively closing the circuit breaker of an individual branch circuit to test a power response thereof to indicate whether the individual branch circuit has a fault therein.

10. A device as recited in claim 9 wherein the requiring means comprises:

a trip circuit connected to the GFCI, said trip circuit including a switch;

a lever for opening the switch, said lever being moveable between an initial position and an activated position, with said lever opening the switch in the activated position;

a means for biasing the lever toward the initial position; and a trigger for selectively controlling movement of the lever.

11. A device as recited in claim 10 wherein the electrical system includes a power panel, the power interface unit includes a mounting plate and spades extending from the mounting plate for electrical connection with the power panel, and said trigger includes a distal end that extends through the mounting plate for contact with the power panel, with said contact between the power panel and the distal end activating said trigger to control movement of the lever.

12. A device as recited in claim 9 wherein, the electrical system is installed in a structure and includes a power panel and a plurality of branch circuits, with each branch circuit having a respective circuit breaker connected to the power panel, the device further comprising a means for selectively closing the circuit breaker of an individual branch circuit to test a power response thereof to indicate whether the individual branch circuit has a fault therein.

13. A device for inspecting an electrical system, wherein the electrical system is installed in a structure and includes a power panel having a meter socket and a plurality of branch circuits, with each branch circuit having a respective circuit breaker connected to the power panel, the device comprising:

a power source;

a toner;

a power interface unit including a Ground Fault Circuit Interrupter (GFCI), with the power interface unit having spades physically and electrically connected to the meter socket of the power panel, a plug physically connected to the power source, and a toner port physically connected to the toner;

a means for selectively providing electrical connection between the power panel and the power source and between the power panel and the toner, with the providing means preventing electrical connection of the toner to the power panel while the power panel is powered by the power source; and a means for selectively closing the circuit breaker of an individual branch circuit during electrical connection between the power panel and the power source to test a power response thereof to indicate whether the individual branch circuit has a fault therein, and during electrical connection between the power panel and the toner to identify the location of the fault in the individual branch circuit.

14. A device as recited in claim 13 further comprising a protective means for automatically opening the GFCI when the device is powered and the power interface unit disconnects from the power panel.

15. A device as recited in claim 14 wherein said protective means includes a means for producing a ground fault when the device is powered and the power interface disconnects from the power panel.

16. A device as recited in claim 15 wherein said producing means includes a trip circuit comprising a ground wire and a neutral wire, with said ground wire connected to said neutral wire when the device is disconnected from the power panel, and wherein said producing means includes a switch for disconnecting the ground wire from said neutral wire when the device is connected to the power panel.

17. A device as recited in claim 13 wherein the protective means comprises:

a trip circuit connected to the GFCI, said trip circuit including a switch;

a lever for opening the switch, said lever being moveable between an initial position and an activated position, with said lever opening the switch in the activated position;

a means for biasing the lever toward the initial position; and a trigger for selectively controlling movement of the lever.

18. A device as recited in claim 17 wherein the power interface unit includes a mounting plate with the spades extending therefrom, and wherein said trigger includes a distal end that extends through the mounting plate for contact with the power panel, with said contact between the power panel and the distal end activating said trigger to control movement of the lever.

19. A device as recited in claim 13 further comprising a power circuit connecting the plug and the spades and a toner circuit connecting the toner port and the spades, wherein the power circuit and the toner circuit share a relay assembly.

20. A device as recited in claim 19 wherein the relay assembly opens the power circuit and closes the toner circuit when the relay assembly is not powered, and wherein the relay assembly closes the power circuit and opens the toner circuit when the relay assembly is powered.

* * * * *